United States Patent
Tirunagari et al.

(10) Patent No.: US 9,401,706 B2
(45) Date of Patent: Jul. 26, 2016

(54) APPARATUS, SYSTEM AND METHOD FOR PROVIDING SWITCHING WITH A T-COIL CIRCUIT

(71) Applicant: Lattice Semiconductor Corporation, Portland, OR (US)

(72) Inventors: Prashanth Tirunagari, Hyderabad (IN); Vinayak Agrawal, Hyderabad (IN); Namrta Sharma, Hyderabad (IN); Manjusha Manchikalapudi, Hyderabad (IN); Rahul Velitheri, Hyderabad (IN)

(73) Assignee: Lattice Semiconductor Corporation, Portland, OR (US)

( * ) Notice: Subject to any disclaimer, the term of this patent is extended or adjusted under 35 U.S.C. 154(b) by 281 days.

(21) Appl. No.: 14/165,340

(22) Filed: Jan. 27, 2014

(65) Prior Publication Data
US 2015/0214943 A1    Jul. 30, 2015

(51) Int. Cl.
*H03K 17/16*    (2006.01)
*H03K 19/0175*    (2006.01)

(52) U.S. Cl.
CPC ............ *H03K 17/16* (2013.01); *H03K 19/0175* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,974,426 | B2* | 7/2011 | Park | H04R 3/00 381/312 |
| 8,176,214 | B2 | 5/2012 | Jones et al. | |
| 8,860,507 | B2* | 10/2014 | Chen | H03F 3/45 330/252 |
| 2004/0145380 | A1* | 7/2004 | Babcock | G01R 31/31926 324/679 |
| 2005/0110566 | A1* | 5/2005 | Bhattacharjee | H03G 3/30 330/140 |
| 2005/0110569 | A1* | 5/2005 | Bhattacharjee | H03F 3/45183 330/254 |
| 2006/0151851 | A1* | 7/2006 | Pillai | H01L 24/05 257/531 |
| 2006/0269088 | A1 | 11/2006 | Julstrom et al. | |
| 2007/0064963 | A1 | 3/2007 | Hawker et al. | |
| 2009/0039916 | A1* | 2/2009 | Buchmann | G11C 5/066 326/38 |
| 2011/0036569 | A1* | 2/2011 | Bass | G01V 3/28 166/250.16 |
| 2011/0049672 | A1* | 3/2011 | Okushima | H01L 23/5227 257/531 |
| 2011/0105055 | A1 | 5/2011 | Ilkov | |
| 2012/0129468 | A1 | 5/2012 | Maimon et al. | |

(Continued)

FOREIGN PATENT DOCUMENTS

KR    10-2013-0126389 A    11/2013

OTHER PUBLICATIONS

"Digital Visual Interface DVI: Revision 1.0," Digital Display Working Group, Apr. 2, 1999, pp. 33-53.

(Continued)

*Primary Examiner* — Thienvu Tran
*Assistant Examiner* — Angela Brooks
(74) *Attorney, Agent, or Firm* — Fenwick & West LLP

(57) ABSTRACT

Techniques and mechanisms for switching between a plurality of inputs each to receive a respective analog signal to be transmitted. In an embodiment, switch circuitry comprises a first input to receive a first signal, a second input to receive a second signal, and one or more T-coil circuits including a first T-coil circuit. A first configuration of the switch circuitry includes a first signal path via a first switch coupled between the first input and a primary input node of the first T-coil circuit. A second configuration of the switch circuitry includes a second signal path via a second switch coupled between the second input and a secondary input node of the first T-coil circuit. In an embodiment, control logic transitions the switch circuitry among a plurality of configurations including the first configuration and the second configuration.

20 Claims, 8 Drawing Sheets

(56) References Cited

U.S. PATENT DOCUMENTS

2013/0064326 A1* 3/2013 Chen .................. H04L 25/0276
375/316
2015/0229285 A1* 8/2015 Nedovic .................. H03F 1/086
330/291

OTHER PUBLICATIONS

"Display Port Standard, Version 1.1," DisplayPort™ Standard, VESA, Mar. 19, 2007, pp. 134-172.
"High-Definition Multimedia Interface: Specification Version 1.3," Hitachi, Ltd., Matsushita Electric Industrial Co., Ltd, Philips Consumer Electronics, International B.V., Silicon Image, Inc., Sony Corporation, Thomson Inc., Toshiba Corporation, Jun. 22, 2006, pp. 10-54.
"High-Definition Multimedia Interface: Specification Version 1.4a," Hitachi, Ltd., Panasonic Corporation, Philips Consumer Electronics, International B.V., Silicon Image, Inc., Sony Corporation, Technicolor, S.A., Toshiba Corporation, Mar. 4, 2010, pp. HEAC 4-25.
Galal, et al., "Broadband ESD protection circuits in CMOS technology" IEEE J.Solid-State Circuits, vol. 38, Dec. 2003, pp. 2334-2340.
Meaamar, et al., "A wideband low power low-noise amplifier in CMOS technology," IEEE Trans. Circuits Syst. I, Reg. Papers, vol. 57, Apr. 2010, pp. 773-782.
PCT International Search Report and Written Opinion, PCT Application No. PCT/US2014/071649, Apr. 7, 2015, 10 pages.

* cited by examiner

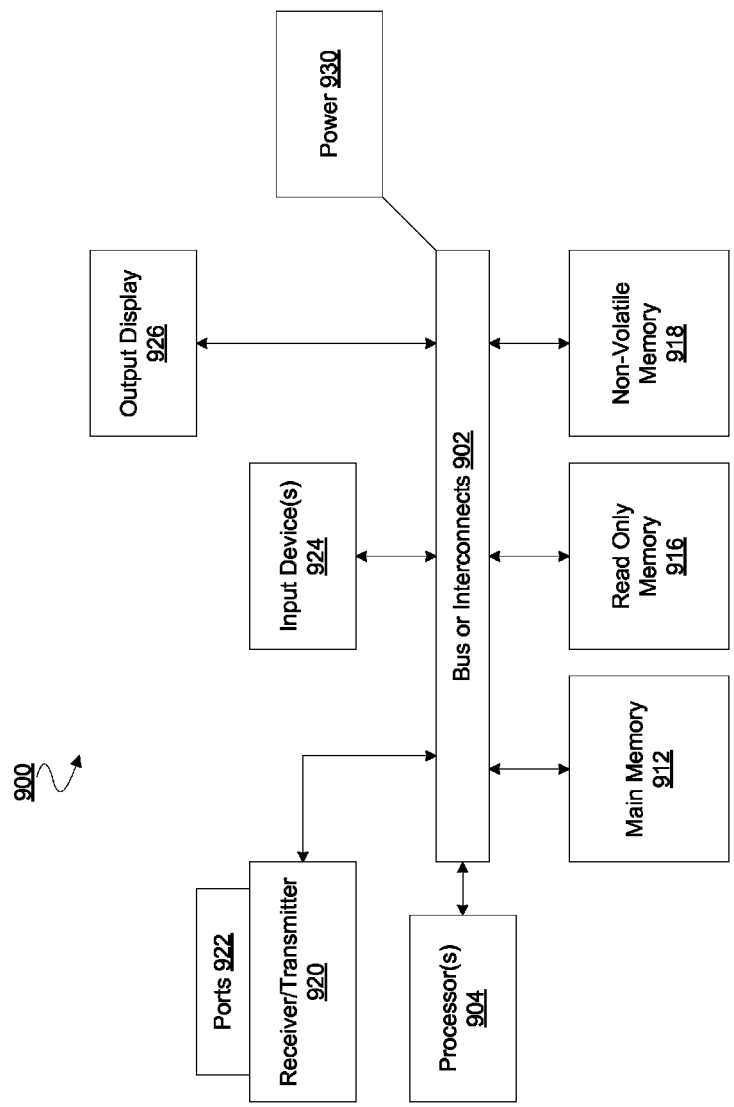

APPARATUS, SYSTEM AND METHOD FOR PROVIDING SWITCHING WITH A T-COIL CIRCUIT

BACKGROUND

1. Technical Field

Embodiments of the invention generally relate to the field of electronic devices and more particularly, but not exclusively, to a method and apparatus for transmission of analog signals.

2. Background Art

Increasingly diverse devices are utilized for data functions such as video and audio storage, transmission, and presentation or rendering. In one example, MHL™ (Mobile High-Definition Link™) provides an audio/video interface to connect portable electronic device to other devices, allowing for transfer of HDMI™ (High-Definition Multimedia Interface) information utilizing connectors with comparatively few pins through the multiplexing of multiple data signals, combining three lanes of HDMI™ data to a single lane of multiplexed data. HDMI™ is a trademark of HDMI Licensing, LLC. A handheld MHL™ device may, for example, allow for direct connection by or with a presentation or rendering device, including, for example, a television set, video monitor, projector, cable or satellite set-top box, video player, including a DVD (Digital Versatile Disk) or Blu-Ray player, audio player, digital video recorder, smartphone, MID (Mobile Internet Device), PID (Personal Internet Device), computer including notebook computer netbook, or other similar device.

Such increasingly diverse devices support data communications according to various different protocols. Moreover, successive generations of such devices are tending to decrease in physical size, and correspondingly tend to be more limited with regard to the physical size of connections. For example, certain handheld and other smaller devices may utilize a micro-USB™ (Universal Serial Bus), mini-USB, or standard USB connector (or socket) compatible with USB protocol, or similar connectors having limited space. The limited types of connections that are available may complicate communications such as those involving high definition data transmission.

BRIEF DESCRIPTION OF THE DRAWINGS

The various embodiments of the present invention are illustrated by way of example, and not by way of limitation, in the figures of the accompanying drawings and in which:

FIG. 9 is a block diagram illustrating elements of a computer system for transmitting analog signals according to an embodiment.

DETAILED DESCRIPTION

Embodiments discussed herein variously make, use or otherwise provide circuit logic to selectively control a device for operation at different times in various ones of a plurality of transmit modes. The plurality of modes may include a high bandwidth operation mode and one or more comparatively low bandwidth operation modes. As used herein with respect to operation modes, the terms "high bandwidth" and "low bandwidth" refer to the characteristic of the high bandwidth mode being for transmitting via a connector at a relatively higher rate, as compared to transmitting via the connector in any of the one or more low bandwidth modes.

Figure 1:
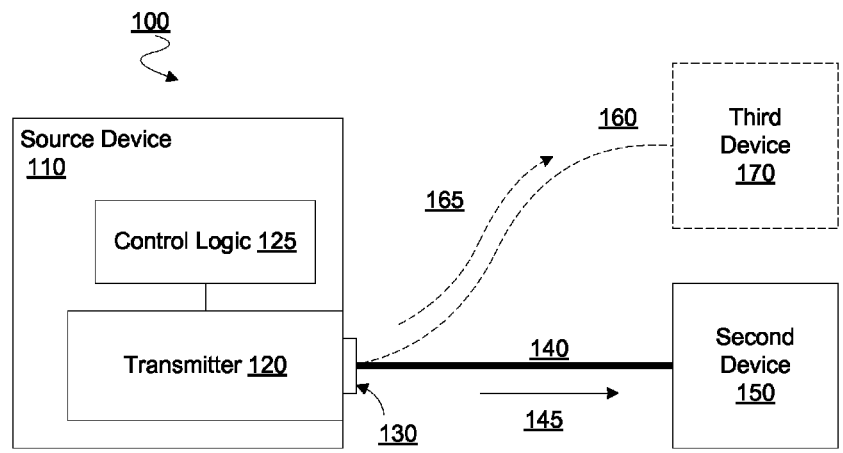
FIG. 1 is a block diagram illustrating elements of a system for exchanging analog signals according to an embodiment.

FIG. 1 illustrates elements of a system 100 for transmitting communications according to an embodiment. System 100 may include a source device 110 comprising transmitter 120 to variously implement communications between source device 110 and one or more other devices. One embodiment may, for example, be implemented entirely within transmitter 120. Another embodiment may be implemented by source device 110 as a whole. Still another embodiment may be implemented by system 100 as a whole. Any of a variety of other embodiments may be alternatively implemented according to techniques discussed herein.

As used herein, the term "source" refers to the characteristic of a device providing communications to some other device. Correspondingly, the term "sink" refers to the characteristic of a device receiving communications from some other (source) device. In an embodiment, source device 110 includes functionality of one or more conventional source devices. By way of illustration and not limitation, source device 110 may include functionality including, but not limited to, that of a personal computer (e.g. tablet, notebook, laptop, desktop and/or the like), camcorder, smart phone, video game console, television, monitor, display, set-top box, home theater receiver and/or the like. Source device 110 may further include functionality of one or more conventional sink devices, although certain embodiments are not limited in this regard.

Source device 110 may include a connector 130, coupled to transmitter 120, to variously connect source device 110 to some other device of system 100 for an exchange of information. In an illustrative embodiment, connector 130 may, at some point in time, couple source device 110 via an interconnect 140 to a second device 150 of system 100—e.g. for an exchange 145 of information from source device 110 to second device 150. Second device 150 may include functionality of one or more conventional sink devices including, but not limited to, a television, monitor, display and/or the like. Other information (not shown) may be further exchanged in the opposite direction, where source device 110 operates as the sink with respect to information transmitted from second device 150. Accordingly, second device 150 may, in an embodiment, further include logic (not shown) to implement—in addition to sink device functionality—conventional source device functionality and/or transmit functionality of an embodiment discussed herein.

Connector 130 may include one or more channels, such as pins and/or other interconnect hardware, the configuration of which is compatible with a particular interface standard. For example, connector 130 may be a micro-USB, mini-USB, or standard USB connector with USB 2.0, USB 3.0 or other USB standard. In another embodiment, connector 130 is compatible with one or more of an HDMI standard such as the HDMI 1.4 standard released May 28, 2009 by HDMI Licensing, LLC of Sunnyvale, Calif., a Mobile High-Definition Link (MHL) standard such as the MHL 1.0 specification released Jun. 30, 2010 by the MHL Consortium of Sunnyvale, Calif., a Digital Visual Interface (DVI) standard such as the DVI 1.0 standard released Apr. 2, 1999 by the Digital Display Working Group of Vancouver, Wash., a DisplayPort standard such as the DisplayPort 1.2 standard released Dec. 22, 2009 by the Video Electronics Standards Association of Newark, Calif. and/or the like.

Transmitter 120 may be selectively transitioned between a plurality of operation modes, including a high bandwidth transmission mode and a low bandwidth transmission mode, each for a respective transmitting via connector 130. For example, a high bandwidth transmission mode may be for transmitter 120 to transmit information via connector 130 at a comparatively high rate. Additionally or alternatively, a low bandwidth transmission mode may be for transmitter 120 to transmit other information via connector 130 at a comparatively low rate. Whether and/or how transmitter 120 might transition between operation modes may be based on detection of a particular characteristic (or absence of said characteristic) regarding connectivity between connector 130 and second device 150. In an embodiment, source device 110 includes logic to implement communications which, at different times, are compatible with different communication standards, where all such communications are via connector 130.

For example, source device 110 may include control logic 125 to detect the presence of a device capable of receiving via connector 130 information of a particular type—e.g. where such information is to be provided at a particular rate. Based on such presence detection, control logic 125 may select one of the plurality of operation modes. Control logic 125 may send one or more control signals to configure transmitter 120 to implement the selected mode. By way of illustration and not limitation, control logic 125 may provide signaling to configure one or more switches (not shown) of transmitter 120.

In an embodiment, the functionality of transmitter 120 allows connector 130 to be variously coupled, decoupled and/or recoupled for various types of communication with the same device and/or with different devices. By way of illustration and not limitation, connector 130 may at some point in time be decoupled from second device 150 and subsequently coupled via an interconnect 160 to some third device 170—e.g. for an exchange 165 of information to third device 170 from source device 110. In an embodiment, third device 170 is simply second device 150—e.g. where second device 150 is decoupled from and subsequently recoupled to source device 110 and/or where second device 150 transitions to a configuration for receiving a different type of communication from source device 110.

Figure 2:
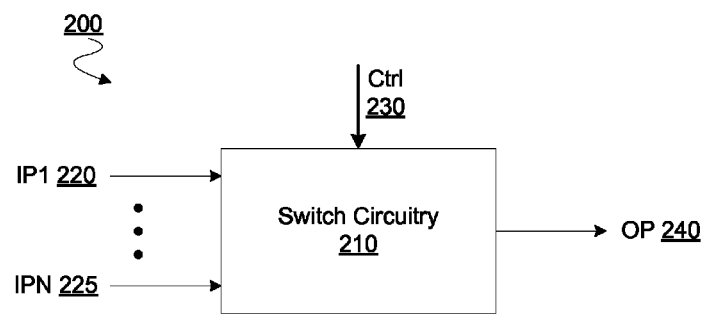
FIG. 2 is a block diagram illustrating elements of a device to provide switching between transmission modes according to an embodiment.

FIG. 2 illustrates elements of a device 200 to provide analog signal communications according to an embodiment. Device 200 may include, or be configured to operate as a component of, source device 110, for example. In an embodiment, device 200 includes some or all of the features of transmitter 120.

Device 200 may include switch circuitry 210—e.g. of transmitter 120—comprising a plurality of inputs IP1 220, ..., IPN 225 and an output OP 240. Switch circuitry 210 may be variously configured at different times to variously implement different modes of a plurality of operational modes. The plurality of operational modes may, for example, include a high bandwidth mode for comparatively high rate transmission via OP 240 and one or more low bandwidth modes each for a respective transmission via OP 240 which has a relatively low rate, as compared to that for the high bandwidth mode. OP 240 may include, or couple to, a pin or other contact hardware of a connector—e.g. connector 130—through which device 200 is to communicate with another device (not shown). In an embodiment, device 200 includes one or more other outputs (not shown) for parallel or other additional signaling via other contact hardware of such a connector.

Device 200 may include or couple to logic (not shown)—e.g. control logic 125—which is to provide a control signal Ctrl 230 for variously transitioning switch circuitry 210 between operational modes. In an embodiment, the plurality of operational modes each include a signal path switchedly configured between OP 240 and a respective one of inputs IP1 220, ..., IPN 225. By way of illustration and not limitation, a first operational mode may include a path configured for signal exchanges between IP1 220 and OP 240. By contrast, a second operational mode may include another path configured for signal exchanges between IPN 225 and OP 240. In an embodiment, the first operational mode does not include the path switchedly configured for signal exchanges between IPN 225 and OP 240, and the second operational mode does not include the path switchedly configured for signal exchanges between IP1 220 and OP 240. Any of a variety of additional or alternative operational modes may be implemented each with a respective signal path of switch circuitry 210, according to different embodiments.

Inputs IP1 220, ..., IPN 225 may be variously coupled each to receive a respective signal of a particular signal type. For example, device 200 may include or couple to logic (not shown) which is to generate or otherwise provide different types of signals at different times—e.g. based on a type of device which is to receive communications from device 200 via OP 240. By way of illustration and not limitation, inputs IP1 220, ..., IPN 225 may include one or more of an input to receive MHL signals, an input to receive USB signals, an input to receive Universal Asynchronous Receiver Transmitter signals, an input to receive audio signals and/or any of a variety of additional or alternative inputs. Some or all such signals may be variously generated or otherwise provided to respective ones of inputs IP1 220, ..., IPN 225 according to conventional techniques, which are not limiting on certain embodiments. In an embodiment, only one of inputs IP1 220, ..., IPN 225 receives a signal at a particular time. Alternatively, two or more of inputs IP1 220, ..., IPN 225 may receive respective signals concurrently, where only one of inputs IP1 220, ..., IPN 225 is switchedly coupled to OP 240 at that particular time.

Switch circuitry 210 may be configurable to choose one out of many possible signal paths between inputs IP1 220, ..., IPN 225 and OP 240. For example, switch circuitry 210 may be included in a mobile phone or other device in which the same USB port, or other such connector, has to support more than one transmitter—e.g. including a USB transceiver, an audio transmitter, an MHL transmitter and/or the like.

In an embodiment, inputs IP1 220, ..., IPN 225 are associated with a different respective differential signal pair, where inputs IP1 220, ..., IPN 225 are each to receive a single component signal of its associated differential signal pair. In such an embodiment, switch circuitry 210 may switch among inputs IP1 220, ..., IPN 225 to provide at OP 240 a single component signal of one of the differential signal pairs. In parallel with such switching, switch circuitry 210 may further switch among other inputs (not shown) of switch circuitry 210 to provide at another output (not shown) of switch circuitry 210 the other component signal of that same one of the differential signal pairs. Alternatively, other switch circuitry (not shown) may include such other inputs and output, where the other switch circuitry is to switch among such other inputs—e.g. in parallel with the switching by switch circuitry 210 among inputs IP1 220, . . . , IPN 225—to provide at its output the other component signal of that same one of the differential signal pairs. Additionally or alternatively, each of IP1 220, . . . , IPN 225 may be for receiving a different respective single-ended signal.

To support many applications, inputs IP1 220, . . . , IPN 225 may be for receiving respective signals having quite different rates. For example, the data rate bandwidth needed for audio data is typically on the order of 20 kHz. By contrast, communications according to USB 2.0 are typically on the order of 480 Mbps and require about 700 MHz of bandwidth to accommodate their rise/fall times. Even higher bandwidths are needed for communications according to MHL 2.0 and/or according to MHL 3.0, for example. Accordingly, communication via OP 240 may not always need to be at the same transmission rate.

Conventional switch architectures variously provide a conjunction of many paths at an output, where a capacitance between the conjunction and a reference potential (e.g. ground) consequently tends to be large enough to affect higher data rate communications. Comparatively low frequency transmissions, such as the communication of audio or signaling according to USB 2.0, may be achievable with such capacitance, if only barely. However, for increasingly high frequency transmissions—e.g. according to MHL 2.0, MHL3.0, USB3.0, etc.—the capacitive characteristics of conventional switch architectures tend to be restrictive.

Figure 3:
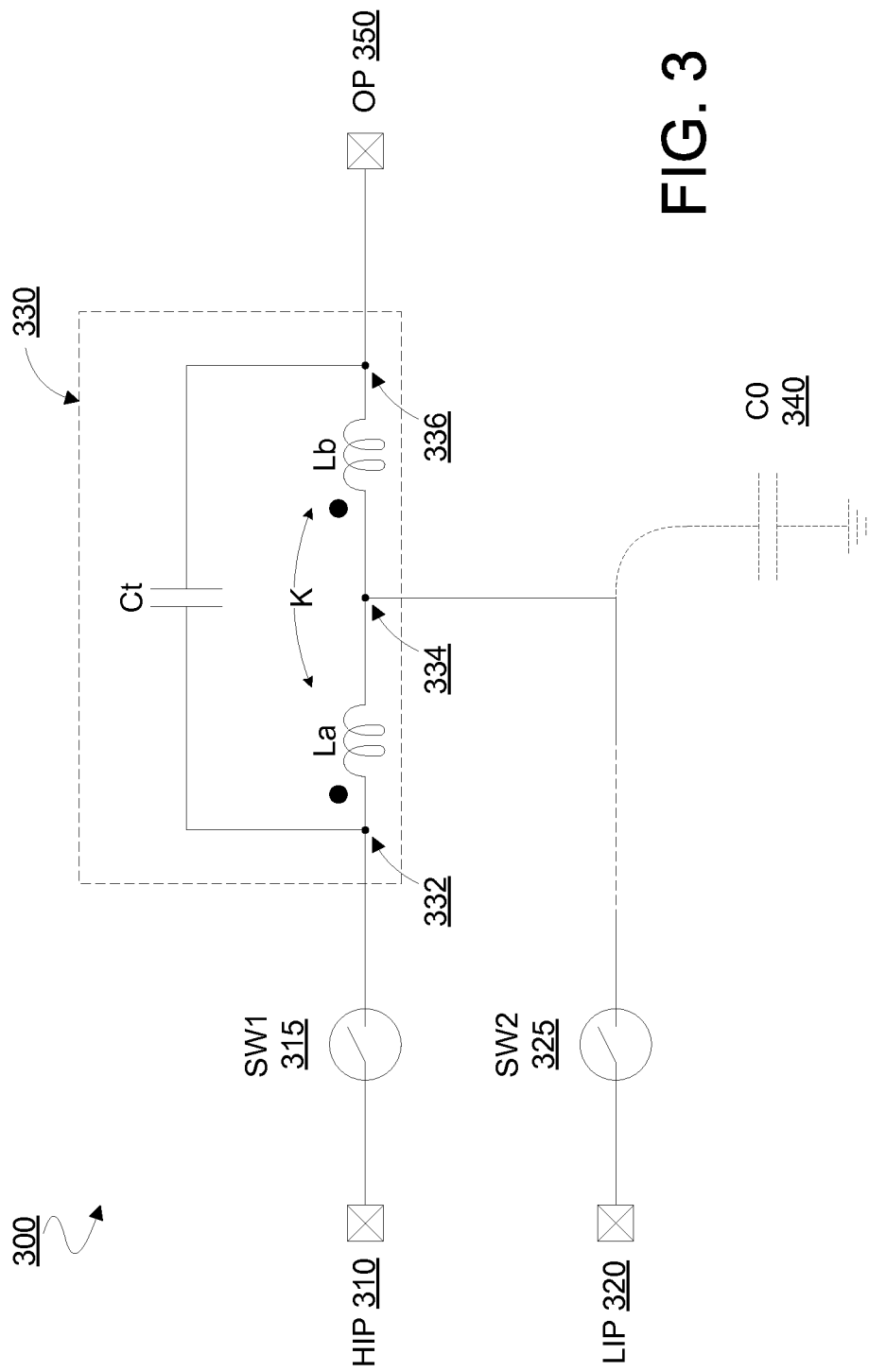
FIG. 3 is a circuit diagram illustrating elements of switch circuitry according to an embodiment.

FIG. 3 illustrates elements of a switch circuitry 300 according to an embodiment for variously providing signals to be transmitted from a device. Switch circuitry 300 may include some or all of the features of switch circuitry 200, for example.

Switch circuitry 300 is one example of an embodiment which includes one or more T-coil circuits. As used herein, "T-coil circuit" refers to a particular configuration of a group of circuit elements including both two inductors coupled in series with each other, and a capacitor which is coupled in parallel with both of the two inductors. A T-coil circuit may be configured to variously receive different signals via, respectively, a primary input node and a secondary input node of the T-coil circuit, and based on one or more such received signals, to provide an output signal via an output node of the T-coil circuit. The capacitor of a T-coil circuit may be coupled between the primary input node and the output node. The two inductors of a T-coil circuit may be coupled in series with one another between the primary input node and the output node—e.g. where the two inductors of the T-coil circuit are coupled to one another via the secondary input node. In an embodiment, the two inductors may be integrated as different respective inductive portions into a single circuit element—commonly referred to as a "center tapped inductor"—which includes a center tap between the two inductive portions to serve as a secondary input node.

As discussed herein, switch circuitry according to different embodiments variously includes a T-coil circuit, a first input and a second input, a first switch coupled between the first input and the T-coil circuit and a second switch coupled between the second input and the T-coil circuit. The first switch may be operable to switchedly configure a first signal path for providing a first signal at the primary input node of the T-coil circuit. Additionally or alternatively, the second switch may be operable to switchedly configure a second signal path for providing a second signal at the secondary input node of the T-coil circuit.

The switch circuitry may switch among a plurality of inputs to selectively couple one such input to an output via the T-coil circuit. In an embodiment, the plurality of inputs are each for receiving a different respective single-ended signal. Alternatively or in addition, the plurality of inputs may each be for receiving a different respective constituent signal of a differential signal pair. By way of illustration and not limitation, the switch circuitry may switch among inputs, for variously coupling to a T-coil circuit, which are each associated with a different respective differential signal pair. Each such input to be switchedly coupled to the T-coil circuit may be for receiving a single component signal of its associated differential signal pair. The switch circuitry may switch among such inputs to provide at a first output a single component signal of one of the differential signal pairs. In such an embodiment, additional switch circuitry (not shown) may operate—e.g. in parallel with that shown in FIG. 3—to switch among other inputs which are each associated with a different respective one of the same differential signal pairs, where such other inputs are each to receive the other component signal of its associated differential signal pair. Such additional switch circuitry may be part of switch circuitry 300, although certain embodiments are not limited in this regard. Such additional switch circuitry may output the other component signal corresponding to that which may be provided, for example, at output OP 350 of switch circuitry 300.

By way of illustration and not limitation, switch circuitry 300 may include T-coil circuit 330 comprising a capacitor Ct coupled between a primary input node 332 and an output node 336. T-coil circuit 330 may further comprise inductors La, Lb coupled in series with one another (and in parallel with Ct) between primary input node 332 and output node 336 of T-coil circuit 330. Inductors La, Lb may be coupled to one another via a secondary input node 334, for example. In an embodiment, inductors La, Lb are configured to provide for an inductive coupling K. In an illustrative scenario according to one embodiment, switch circuitry 300 compensates for bandwidth loss due to parasitic capacitance CO of about 2 pF with inductors La, Lb which each have a respective inductance of 0.25 nanohenries (nH) and which have a coupling K with one another of 0.5, and with Ct having a capacitance of 25 femptofarads (fF). However, such values for La, Lb, K, Ct and CO may vary according to implementation-specific details, and different T-coil circuits of a switch circuit may include different capacitances, inductors and/or inductive coupling.

Switch circuitry 300 may further comprise inputs HIP 310 and LIP 320—e.g. where HIP 310 is to receive a relatively high bandwidth first signal and LIP 320 is to receive a relatively low bandwidth second signal. In an embodiment, a first switch SW1 315 of switch circuitry 300 is coupled between HIP 310 and primary input node 332, and a second switch SW2 325 of switch circuitry 300 is coupled between LIP 320 and secondary input node 334. For example, second switch SW2 325 may be coupled directly to secondary input node 334, although certain embodiments are not limited in this regard. The arrangement of T-coil circuit 330 in switch circuitry 300—e.g. in combination with a resistive termination of a receiver (not shown) which is to couple to switch circuitry 300 via OP 350—may reduce the effect of parasitic capacitance on an output signal which would otherwise occur due to, for example, circuit structures for one or more unused inputs of switch circuitry 300. For example, at a given time, signal lines and/or other circuit components for one or more inputs which are not currently in use (e.g. LIP 320) may be a source of parasitic capacitance which affects a signal received via an input which is currently in use (e.g. HIP 310). An example of such parasitic capacitance is represented by an illustrative capacitance CO 340 between secondary node 334 and a reference potential (e.g. ground).

In operation, switch circuitry 300 may be variously transitioned between a plurality of operational modes which each include a path switchedly configured for a signal exchange between a respective one of a plurality of inputs—e.g. including HIP 310 and LIP 320—and output OP 350 of switch circuitry 300. For example, to implement a first operational mode, SW1 315 may be placed in a closed state and/or SW2 325 may be placed in an open state—e.g. based on a control signal such as Ctrl 230—for OP 350 to exchange signaling with HIP 310 (rather than LIP 320) via T-coil circuit 330. At some other point in time, switch circuitry 300 may be placed in a second operational mode—e.g. wherein SW1 315 is placed in an open state, and/or SW2 325 placed in a closed state—for OP 350 to exchange signaling with LIP 320 (rather than HIP 310) via T-coil circuit 330.

In receiving relatively high bandwidth signals via primary input node 332, T-coil 330 may reduce an effect of parasitic capacitance CO 340 to preserve high-frequency signal components being communicated from HIP 310 to OP 350. However, since relatively low bandwidth signals are to be received via secondary input node 334, the communication of comparatively low-frequency signals from LIP 320 to OP 350 is not overly hindered by T-coil circuit 300.

Figure 4:
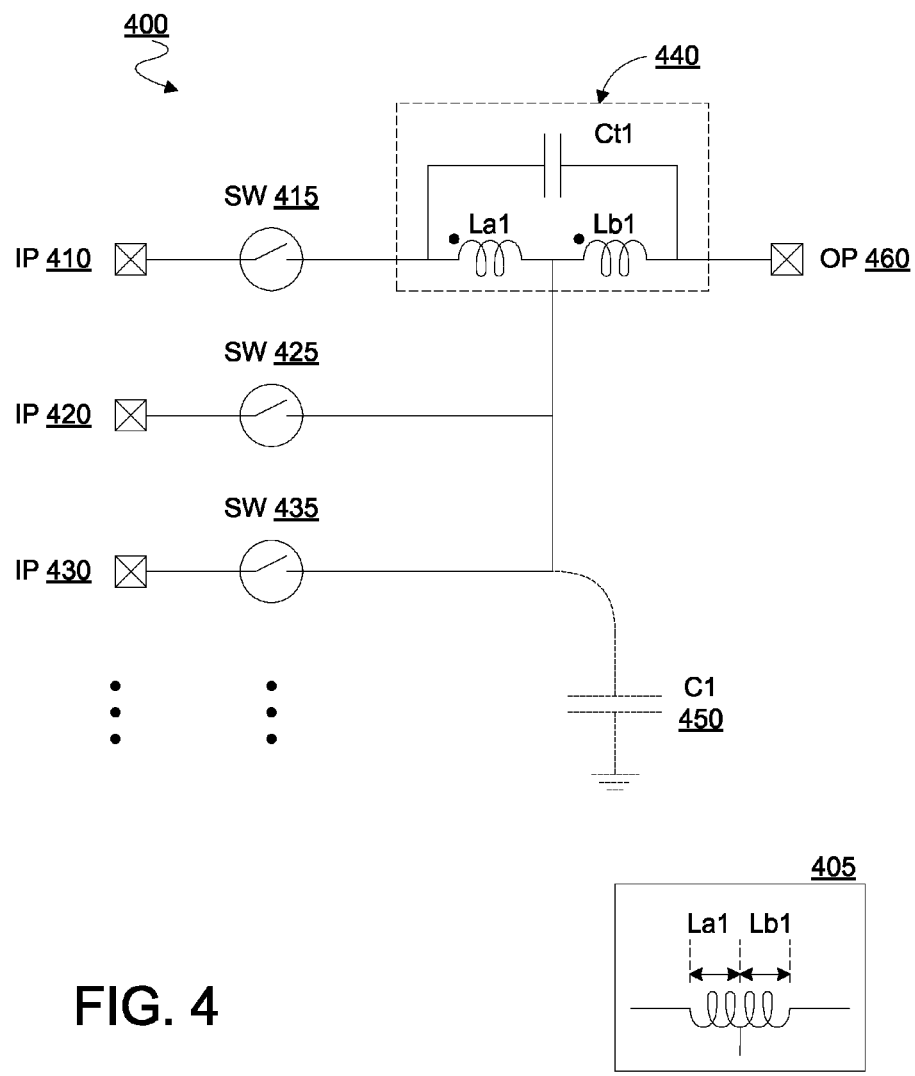
FIG. 4 is a circuit diagram illustrating elements of switch circuitry according to an embodiment.

FIG. 4 illustrates elements of switch circuitry 400 according to an embodiment for variously providing signals to be transmitted. Switch circuitry 400 may include some or all of the features of switch circuitry 300, for example.

Switch circuitry 400 may comprise a plurality of inputs—e.g. represented by the illustrative inputs 410, 420, 430—each to receive a respective signal. An output OP 460 of switch circuitry 400 may provide an output signal based on an operational mode of switch circuitry 400 and a signal provided at a corresponding one of inputs 410, 420, 430. In an embodiment, switch circuitry 400 further includes T-coil circuit 440 having some or all of the features of T-coil circuit 330, for example. By way of illustration and not limitation, T-coil circuit 440 may include capacitor Ct1 and inductors La1, Lb1 corresponding, respectively, to capacitor Ct and inductors La, Lb. As shown in inset 405, inductors La1, Lb1 may include different respective inductive portions of a center tapped inductor device, where the center tap between the inductive portions is to serve as a secondary input node of T-coil circuit 440. The arrangement of T-coil circuit 440 in switch circuitry 400 may reduce an effect of parasitic capacitance on an output signal which might otherwise occur due, for example, to circuit structures for one or more unused inputs of switch circuitry 400. Such parasitic capacitance may include, for example, the illustrative parasitic capacitance C1 450.

In an embodiment, a switch SW 415 of switch circuitry 400 is coupled between IP 410 and the primary input node of T-coil circuit 440. Alternatively or in addition, a plurality of other inputs may be coupled directly or indirectly to the secondary input node of T-coil circuit 440. By way of illustration and not limitation, a switch SW 425 may be coupled between IP 420 and the secondary input node of T-coil circuit 440, and/or a switch SW 435 may be coupled between IP 430 and the secondary input node of T-coil circuit 440. Any of a variety of additional or alternative inputs may be switchedly coupled to the secondary input of T-coil circuit 440, according to different embodiments.

In operation, switch circuitry 400 may be variously transitioned between a plurality of operational modes—e.g. where for each of the plurality of operational modes, a corresponding one (and only one) of inputs 410, 420, 430, . . . etc. is switchedly coupled for a signal exchange with OP 460 via T-coil circuit 440. For example, switch 415 may be operable to switchedly configure a signal path for providing a signal from switch 415 directly to the primary input node of T-coil circuit 440. Alternatively or in addition, switch 425 may be operable to switchedly configure a signal path for providing a signal from switch 425 directly to the secondary input node of T-coil circuit 440. Alternatively or in addition, switch 435 may be operable to switchedly configure another signal path for providing another signal from switch 435 directly to the secondary input node of T-coil circuit 440.

In certain embodiment, T-coil circuit 440 variously provides improved high-frequency bandwidth characteristics for transmissions based on signals received via IP 410. Such improvements are provided with relatively minor impairment to comparatively low-frequency bandwidth transmissions based on signals received via IP 420 and/or via IP 430.

Figure 5:
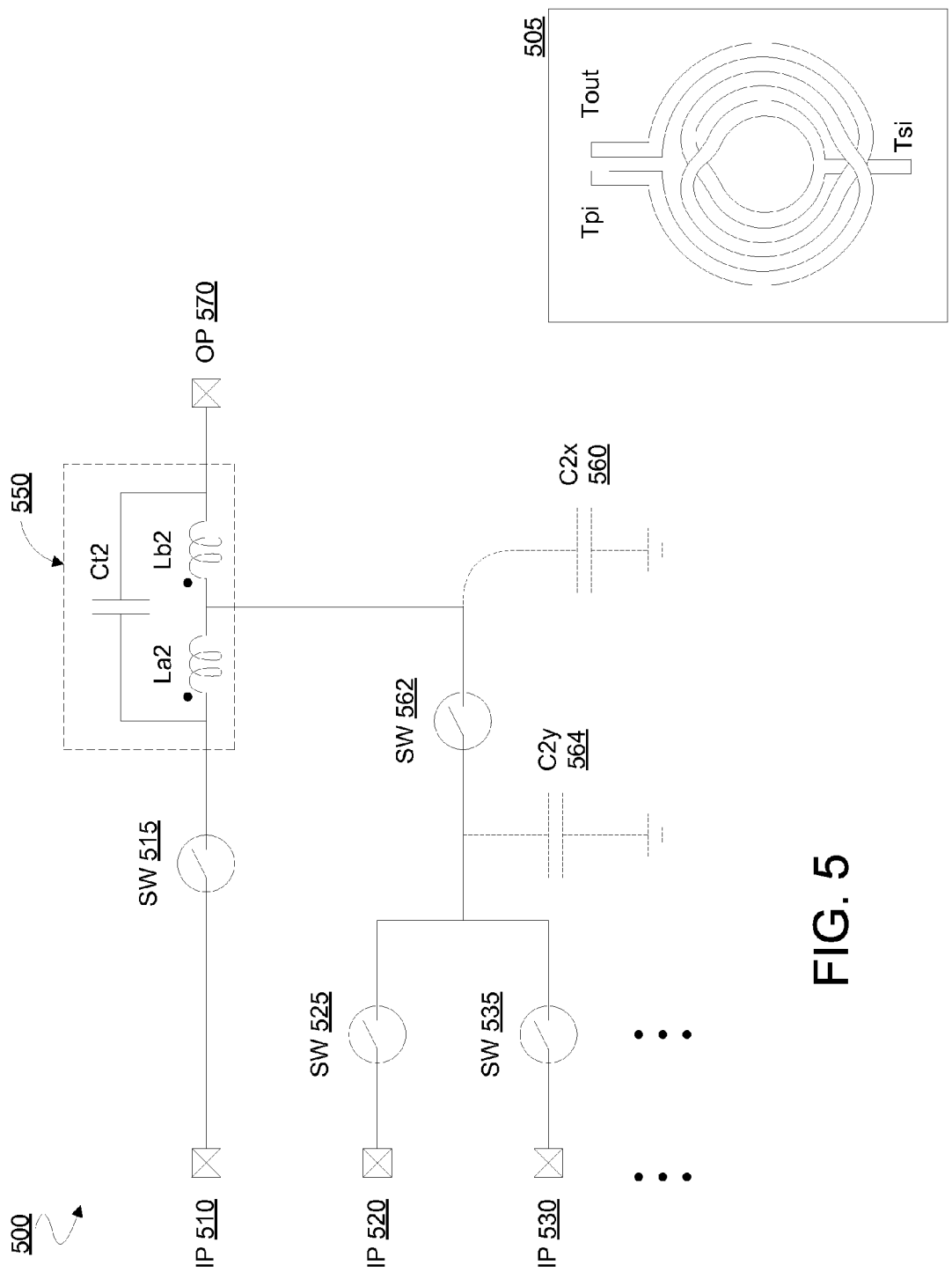
FIG. 5 is a circuit diagram illustrating elements of switch circuitry according to an embodiment.

FIG. 5 illustrates elements of switch circuitry 500 according to an embodiment to variously provide signals for transmission. Switch circuitry 500 may include some or all of the features of switch circuitry 300, for example.

Switch circuitry 500 may comprise a plurality of inputs—e.g. represented by the illustrative inputs 510, 520, 530—each to receive a respective signal. An output OP 570 of switch circuitry 500 may provide an output signal based on an operational mode of switch circuitry 500 and a signal provided at a corresponding one of inputs 510, 520, 530. In an embodiment, switch circuitry 500 further includes T-coil circuit 550 having some or all of the features of T-coil circuit 330, for example. By way of illustration and not limitation, T-coil circuit 550 may include capacitor Ct2 and inductors La2, Lb2 corresponding, respectively, to capacitor Ct and inductors La, Lb. As shown in inset 505, inductors La2, Lb2 may include different respective inductive portions of a center tapped inductor device. For example, inductor La2 may comprise a coiled portion coupling a primary input terminal Tpi to a secondary input terminal Tsi which serves as the center tap of such an inductor device. Inductor Lb2 may comprise another coiled potion coupling secondary input terminal Tsi to an output terminal Tout of the inductor device. In an embodiment, switch circuitry 500 further comprises a capacitor C2x 560 coupled between the secondary input node of T-coil circuit 550 and a node which is to provide a ground (or other reference voltage).

In an embodiment, a switch SW 515 of switch circuitry 500 is coupled between IP 510 and the primary input node of T-coil circuit 550. Alternatively or in addition, a plurality of other inputs may be coupled directly or indirectly to the secondary input node of T-coil circuit 550. By way of illustration and not limitation, a switch SW 525 may be coupled between IP 520 and the secondary input node of T-coil circuit 550 and/or a switch SW 535 may be coupled between IP 530 and the secondary input node of T-coil circuit 550. Another switch 562 of switch circuitry 500 may be coupled between each of switches 525, 535 and the secondary input node of T-coil circuit 550. Any of a variety of additional or alternative plurality of inputs may be coupled to the secondary input node of T-coil circuit 550 via switch 562, according to different embodiments. The arrangement of T-coil circuit 550 in switch circuitry 500 may reduce an effect of parasitic capacitance on an output signal which might otherwise occur due, for example, to circuit structures for one or more unused inputs of switch circuitry 500. Such parasitic capacitance may include, for example, one or more of illustrative parasitic capacitances C2x 560 and C2y 564.

In operation, switch circuitry 500 may be variously transitioned between a plurality of operational modes—e.g. where for each of the plurality of operational modes, a corresponding one (and only one) of inputs 510, 520, 530 . . . etc. is switchedly coupled for a signal exchange with OP 570 via T-coil circuit 550. For example, a first operational mode may include switch 515 being in a closed state to switchedly couple IP 510 to the primary input of T-coil circuit 550. In such a first operational mode, each of the other inputs of switch circuitry 500—e.g. including each of inputs 520, 530—may be switchedly decoupled from the secondary input of T-coil circuit 550. By way of illustration and not limitation, switch 562 and/or each of switches 525, 535 may be in respective open states for the first operational mode.

In an embodiment, the plurality of operational modes further includes modes which each comprise switch 515 being in an open state and switch 562 being in a closed state. Such modes may each further comprise a different respective one—and only that respective one—of inputs 520, 530 being switchedly coupled via a corresponding one of switches 525, 535 to the secondary input of T-coil circuit 550.

Figure 6:
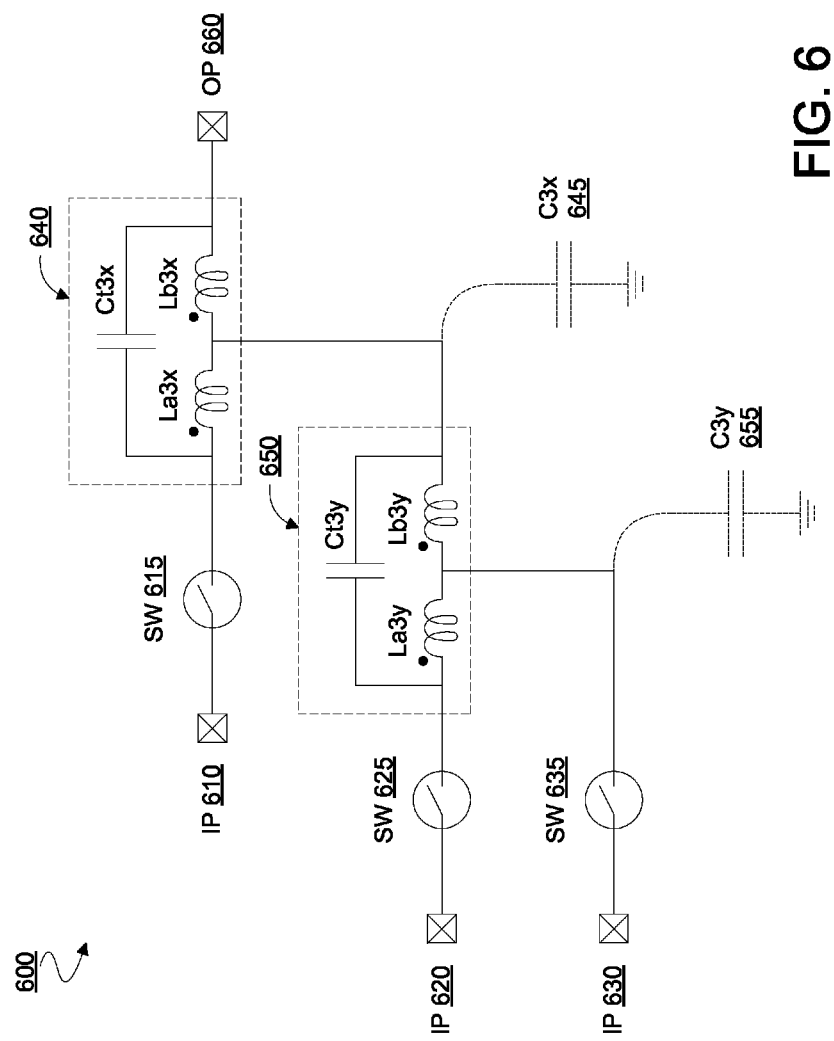
FIG. 6 is a circuit diagram illustrating elements of switch circuitry according to an embodiment.

FIG. 6 illustrates elements of switch circuitry 600 according to an embodiment to variously provide signals for transmission. Switch circuitry 600 may include some or all of the features of switch circuitry 300, for example. Switch circuitry 600 may comprise a plurality of inputs—e.g. represented by the illustrative inputs 610, 620, 630—each to receive a respective signal. An output OP 660 of switch circuitry 600 may provide an output signal based on an operational mode of switch circuitry 600 and a signal provided at a corresponding one of inputs 610, 620, 630.

In an embodiment, switch circuitry 600 further includes T-coil circuit 640 having some or all of the features of T-coil circuit 330, for example. By way of illustration and not limitation, T-coil circuit 640 may include capacitor Ct3$x$ and inductors La3$x$, Lb3$x$ to provide functionality corresponding to that of capacitor Ct and inductors La, Lb, respectively. A switch SW 615 of switch circuitry 600 may be coupled between IP 610 and the primary input node of T-coil circuit 640. In an embodiment, a plurality of other inputs may be variously coupled directly or indirectly to the secondary input node of T-coil circuit 640. By way of illustration and not limitation, switch circuitry 600 may further include T-coil circuit 650 comprising capacitor Ct3$y$ and inductors La3$y$, Lb3$y$ to provide functionality corresponding to provide functionality corresponding to that of capacitor Ct and inductors La, Lb, respectively. T-coil circuits 640, 650 may be substantially identical to one another, although certain embodiments are not limited in this regard. The arrangement of T-coil circuits 640, 650 in switch circuitry 600 may reduce an effect of parasitic capacitance on an output signal which might otherwise occur due, for example, to circuit structures for one or more unused inputs of switch circuitry 600. Such parasitic capacitance may include, for example, one or more of illustrative parasitic capacitances C3$x$ 645 and C3$y$ 655.

A switch SW 625 of switch circuitry 600 may be coupled between IP 620 and the primary input node of T-coil circuit 650. Alternatively or in addition, a switch SW 635 may be coupled between IP 630 and the secondary input node of T-coil circuit 650. Any of a variety of additional or alternative inputs may be switchedly coupled to T-coil circuit 650, according to different embodiments.

Switch circuitry 600 includes T-coil circuits 640, 650 in a nested configuration which, for example, supports input 610 receiving signals of a relatively higher frequency, input 620 receiving signals of a relatively median frequency, and input 630 receiving signals of a relatively lower frequency. In operation, switch circuitry 600 may be variously transitioned between a plurality of operational modes—e.g. where for each of the plurality of operational modes, a corresponding one (and only one) of inputs 610, 620, 630 is switchedly coupled for a signal exchange with OP 660 via T-coil circuit 640. For example, a first operational mode may include switch 615 being in a closed state to switchedly couple IP 610 to the primary input of T-coil circuit 550. In such a first operational mode, each of the other inputs of switch circuitry 600—e.g. including each of inputs 620, 630—may be switchedly decoupled from the secondary input of T-coil circuit 640. By way of illustration and not limitation, each of switches 625, 635 may be in respective open states for the first operational mode.

In an embodiment, the plurality of operational modes includes other modes which are each to switchedly provide a path between OP 660 and a respective one (e.g. and only one) of the other inputs—e.g. including inputs 620, 630—for a signal exchange with via T-coil circuit 640. For example, each such other mode may include switch 615 being in an open state a respective one (and only one) of switches 625, 635 being in a closed state.

Figure 7:
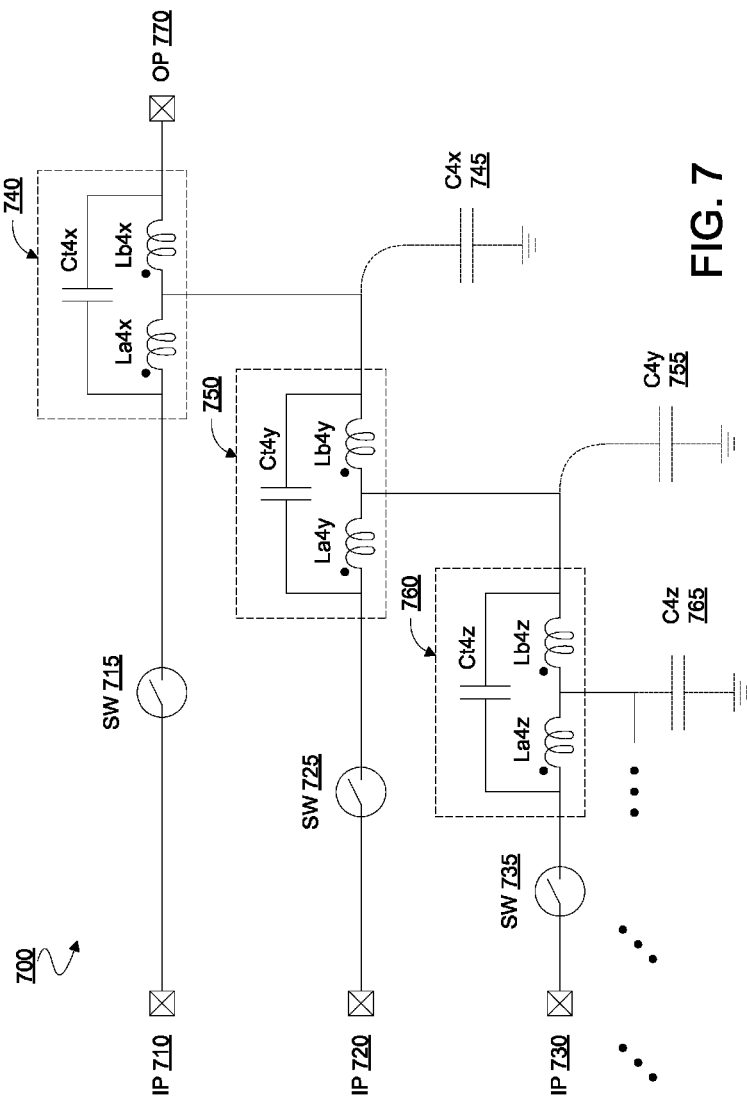
FIG. 7 is a circuit diagram illustrating elements of switch circuitry according to an embodiment.

FIG. 7 illustrates elements of switch circuitry 700 according to an embodiment to variously provide signals for transmission. Switch circuitry 700 may include some or all of the features of switch circuitry 300, for example. Switch circuitry 700 may comprise a plurality of inputs—e.g. represented by the illustrative inputs 710, 720, 730—each to receive a respective signal. An output OP 760 of switch circuitry 700 may provide an output signal based on an operational mode of switch circuitry 700 and a signal provided at a corresponding one of inputs 710, 720, 730.

Switch circuitry 700 may comprise another configuration of nested T-coil circuits which, for example, includes T-coil circuits 740, 750, 760. In an embodiment, T-coil circuit 740 includes capacitor Ct4$x$ and inductors La4$x$, Lb4$x$, T-coil circuit 750 includes capacitor Ct4$y$ and inductors La4$y$, Lb4$y$ and T-coil circuit 760 includes capacitor Ct4$z$ and inductors La4$z$, Lb4$z$. The output node of T-coil circuit 750 may be coupled to the secondary input node of T-coil circuit 740, and the output node of T-coil circuit 760 may be coupled to the secondary input node of T-coil circuit 750. The arrangement of T-coil circuits 740, 750, 760 in switch circuitry 700 may reduce an effect of parasitic capacitance on an output signal which might otherwise occur due, for example, to circuit structures for one or more unused inputs of switch circuitry 700. Such parasitic capacitance may include, for example, one or more of illustrative parasitic capacitances C4$x$ 745, C4$y$ 755 and C4$z$ 765.

A switch SW 715 of switch circuitry 700 may be coupled between IP 710 and the primary input node of T-coil circuit 740. Additionally or alternatively, switch SW 725 may be coupled between IP 720 and the primary input node of T-coil circuit 750 and/or switch SW 735 may be coupled between IP 730 and the primary input node of T-coil circuit 760. In operation, switch circuitry 700 may be variously transitioned between a plurality of operational modes—e.g. where for each of the plurality of operational modes, a corresponding one (and only one) of inputs 710, 720, 730 is switchedly coupled for a signal exchange with OP 760 via T-coil circuit 740. For example, each of the plurality of modes may include a different respective one (and only one) of switches 715, 725, 735 being in an closed state to provide a path for signaling between OP 770 and a corresponding one of inputs 710, 720, 730.

Figure 8:
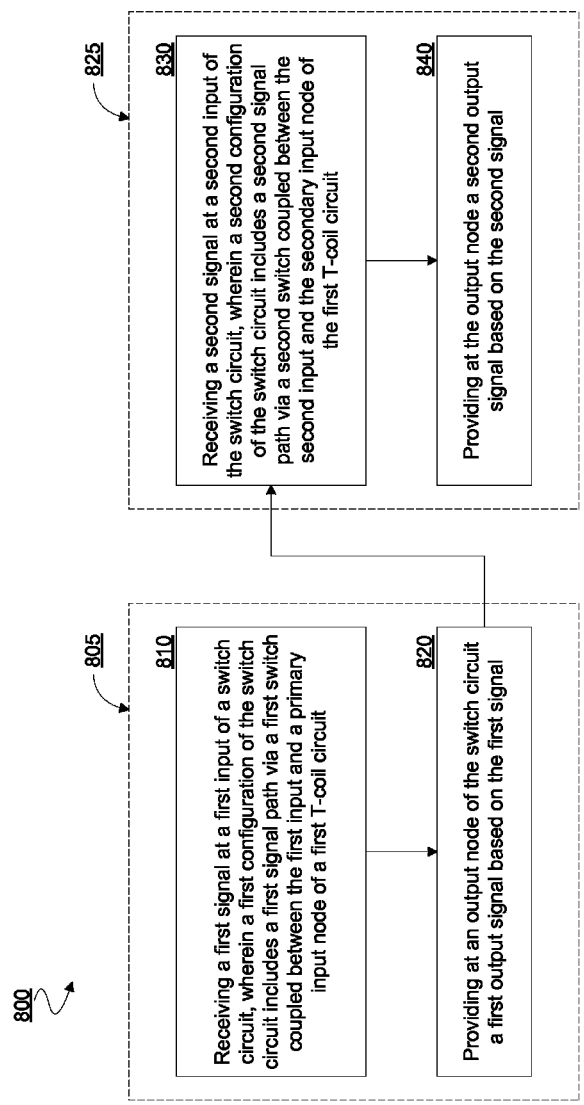
FIG. 8 is a flow diagram illustrating elements of a method for operating a switch circuit according to an embodiment.

FIG. 8 illustrates elements of a method 800 for transmitting analog signals according to an embodiment. Method 800 may be performed by a device including some or all of the features of source device 110. In an embodiment, method 800 is performed with one of the various switch circuitry 210, 300, 400, 500, 600 and 700.

Method 800 may include operations 805 performed during a first configuration of switch circuitry including one or more T-coil circuits comprising a first T-coil circuit. Each of the one or more T-coil circuits may include a respective capacitor and two respective inductors coupled in series with each other via a secondary input node of the T-coil circuit, wherein the capacitor of the T-coil circuit is coupled in parallel with the two inductors of the T-coil circuit between a primary input node of the T-coil circuit and an output node of the T-coil circuit.

The operations 805 may include, at 810, receiving a first signal at a first input of the switch circuitry, wherein the first configuration includes a first signal path via a first switch coupled between the first input and the primary input node of the first T-coil circuit. The operations 805 may further include, at 820, providing at an output node of the switch circuitry a first output signal based on the first signal.

Method 800 may further include operations 825 performed during a second configuration of switch circuitry. The operations 825 may include, at 830, receiving a second signal at a second input of the switch circuitry, wherein the second configuration includes a second signal path via a second switch coupled between the second input and the secondary input node of the first T-coil circuit. The operations 825 may further include, at 840, providing at the output node a second output signal based on the second signal.

Method 800 may further include other operations (not shown) which are performed during any of various other configurations of switch circuitry. For example, during a third configuration, the switch circuitry may receive a third signal at a third input of the switch circuitry, wherein the third configuration includes a third signal path via a third switch coupled between the third input and the secondary input node of the first T-coil circuit. The third switch may be coupled between the third input and the secondary input of the first T-coil circuit. By way of illustration and not limitation, the third switch may be coupled to the first T-coil circuit via a second, nested T-coil circuit of the switch circuitry. In an embodiment, the switch circuit is variously transitioned between different configurations—e.g. by logic such as control logic 125—where each such configuration is for providing a complete signal path between only one respective input of the switch circuitry and an output of the switch circuitry.

FIG. 9 is an illustration of an apparatus or system for transmitting analog signals according to an embodiment. Such an apparatus or system may include some or all of the features of source device 110, for example. In an embodiment, the apparatus or system includes circuitry to perform method 800.

In some embodiments, an apparatus or system 900 (referred to here generally as an apparatus) comprises an interconnect or crossbar 902 or other communication means for transmission of data. The apparatus 900 may include a processing means such as one or more processors 904 coupled with the interconnect 902 for processing information. The processors 904 may comprise one or more physical processors and/or one or more logical processors. The interconnect 902 is illustrated as a single interconnect for simplicity, but may represent multiple different interconnects or buses and the component connections to such interconnects may vary. The interconnect 902 shown in FIG. 9 is an abstraction that represents any one or more separate physical buses, point to point connections, or both connected by appropriate bridges, adapters, controllers and/or the like.

In some embodiments, the apparatus 900 further comprises a random access memory (RAM) or other dynamic storage device or element as a main memory 912 for storing information and instructions to be executed by the processors 904. In some embodiments, main memory may include active storage of applications including a browser application for using in network browsing activities by a user of the apparatus 900. In some embodiments, memory of the apparatus may include certain registers or other special purpose memory.

The apparatus 900 also may comprise a read only memory (ROM) 916 or other static storage device for storing static information and instructions for the processors 904. The apparatus 900 may include one or more non volatile memory elements 918 for the storage of certain elements, including, for example, flash memory, a hard disk, solid-state drive and/or the like.

One or more transmitters or receivers 920 may also be coupled to the interconnect 902. The receivers or transmitters 920 may include one or more ports 922 for the connection of one or more other apparatuses (not shown). In some embodiments, transmitters or receivers 920 includes some or all of the features of transmitter 120. For example, transmitters or receivers 920 may include a plurality of transmit circuits each to provide a respective signal for transmission via an output to ports 922. Transmitters or receivers 920 may further include switch circuitry—e.g. including any of the various switch circuitry 210, 300, 400, 500, 600—to variously switch between providing the respective signals from the plurality of transmit circuits to the output to ports 922.

The apparatus 900 may also be coupled via the interconnect 902 to an output display 926. In some embodiments, the display 926 may include a liquid crystal display (LCD) or any other display technology, for displaying information or content to a user, including three-dimensional (3D) displays. In some environments, the display 926 may include a touch screen that is also utilized as at least a part of an input device. In some environments, the display 926 may be or may include an audio device, such as a speaker for providing audio information.

The apparatus 900 may also comprise a power device or apparatus 930, which may comprise a power supply, a battery, a solar cell, a fuel cell, or other system or device for providing or generating power. The power provided by the power device or system 930 may be distributed as required to elements of the apparatus 900.

Techniques and architectures for transmitting analog signals are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An apparatus comprising: a switch circuit including:
   one or more T-coil circuits comprising a first T-coil circuit, each of the one or more T-coil circuits including:
   a respective capacitor; and
   two respective inductors coupled in series with each other via a secondary input node of the T-coil circuit, wherein the capacitor of the T-coil circuit is coupled in parallel with the two inductors of the T-coil circuit between a primary input node of the T-coil circuit and an output node of the T-coil circuit;
   a first input to receive a first signal;
   a first switch coupled between the first input and the primary input node of the first T-coil circuit, the first switch to switchedly configure a first signal path for the first signal;
   a second input to receive a second signal; and
   a second switch coupled between the second input and the secondary input node of the first T-coil circuit, the second switch to switchedly configure a second signal path for the second signal.

2. The apparatus of claim 1, wherein the second switch to switchedly configure the second signal path for providing the second signal from the second switch directly to the secondary input node of the first T-coil circuit.

3. The apparatus of claim 2, the switch circuit further comprising:
   a third input to receive a third signal; and
   a third switch coupled between the third input and the secondary input node of the first T-coil circuit, the third switch to switchedly configure a third signal path for providing the third signal from the third switch directly to the secondary input node of the first T-coil circuit.

4. The apparatus of claim 1, the switch circuit further comprising:
   a third input to receive a third signal;
   a third switch coupled between the third input and the secondary input node of the first T-coil circuit, the third switch to switchedly configure a third signal path for the third signal; and
   a fourth switch to switchedly configure a fourth signal path between the second switch and the secondary input node of the first T-coil circuit, wherein the fourth signal path is also between the third switch and the secondary input node of the first T-coil circuit.

5. The apparatus of claim 1, the one or more T-coil circuits further comprising a second T-coil circuit, wherein the second switch is coupled between the second input and the primary input node of the second T-coil circuit, and wherein the output node of the second T-coil circuit is coupled to the secondary input node of the first T-coil circuit, the switch circuit further comprising:
   a third input to receive a third signal; and
   a third switch coupled between the third input and the second T-coil circuit, the third switch to switchedly configure a third signal path for the third signal.

6. The apparatus of claim 1, the one or more T-coil circuits further comprising:
   a second T-coil circuit, wherein the second switch is coupled between the second input and the primary input node of the second T-coil circuit, and wherein the output node of the second T-coil circuit is coupled to the secondary input node of the first T-coil circuit; and
   a third T-coil circuit, wherein the output node of the third T-coil circuit is coupled to the secondary input node of the second T-coil circuit;
   the switch circuit further comprising:
   a third input to receive a third signal; and
   a third switch coupled between the third input and the primary input node of the third T-coil circuit, the third switch to switchedly configure a third signal path for the third signal.

7. The apparatus of claim 1, further comprising a plurality of transmit circuits each coupled to a respective input of the switch circuit, the plurality of transmit circuits including a first transmit circuit to provide the first signal to the first input and a second transmit circuit to provide the second signal to the second input.

8. The apparatus of claim 1, further comprising control logic coupled to the switch circuit, the control logic to transition the switch circuit between a first configuration and a second configuration, including the control logic to change a switch state of one of the first switch and the second switch.

9. A method comprising: with switch circuitry:
during a first configuration of the switch circuitry:
receiving a first signal at a first input, wherein the switch circuitry includes one or more T-coil circuits comprising a first T-coil circuit, each of the one or more T-coil circuits including:
a respective capacitor; and
two respective inductors coupled in series with each other via a secondary input node of the T-coil circuit, wherein the capacitor of the T-coil circuit is coupled in parallel with the two inductors of the T-coil circuit between a primary input node of the T-coil circuit and an output node of the T-coil circuit; and
wherein the first configuration includes a first signal path via a first switch coupled between the first input and the primary input node of the first T-coil circuit;
providing at an output node of the switch circuitry a first output signal based on the first signal; and
during a second configuration of the switch circuitry:
receiving a second signal at a second input of the switch circuitry, wherein the second configuration includes a second signal path via a second switch coupled between the second input and the secondary input node of the first T-coil circuit; and
providing at the output node a second output signal based on the second signal.

10. The method of claim 9, further comprising:
transitioning the switch circuit between a first configuration and a second configuration, including changing a switch state of one of the first switch and the second switch.

11. The method of claim 9, further comprising:
during a third configuration of the switch circuitry:
receiving a third signal at a third input of the switch circuitry, wherein the third configuration includes a third signal path via a third switch coupled between the third input and the secondary input node of the first T-coil circuit; and
providing at the output node a third output signal based on the third signal.

12. The method of claim 11, wherein the one or more T-coil circuits further comprise a second T-coil circuit, wherein the second switch is coupled between the second input and the primary input node of the second T-coil circuit, wherein the third switch is coupled between the third input and the secondary input node of the second T-coil circuit, and wherein the output node of the second T-coil circuit is coupled to the secondary input node of the first T-coil circuit.

13. A system comprising:
a source device including a switch circuit comprising:
one or more T-coil circuits comprising a first T-coil circuit, each of the one or more T-coil circuits including:
a respective capacitor; and
two respective inductors coupled in series with each other via a secondary input node of the T-coil circuit, wherein the capacitor of the T-coil circuit is coupled in parallel with the two inductors of the T-coil circuit between a primary input node of the T-coil circuit and an output node of the T-coil circuit;
a first input to receive a first signal;
a first switch coupled between the first input and the primary input node of the first T-coil circuit, the first switch to switchedly configure a first signal path for the first signal;
a second input to receive a second signal; and
a second switch coupled between the second input and the secondary input node of the first T-coil circuit, the second switch to switchedly configure a second signal path for the second signal;
an interconnect coupled to the source device; and
a sink device coupled to the source device via the interconnect, wherein the interconnect to exchange between the source device and the sink device an output signal from the switch circuit.

14. The system of claim 13, wherein the second switch to switchedly configure the second signal path for providing the second signal from the second switch directly to the secondary input node of the first T-coil circuit.

15. The system of claim 14, the switch circuit further comprising:
a third input to receive a third signal; and
a third switch coupled between the third input and the secondary input node of the first T-coil circuit, the third switch to switchedly configure a third signal path for providing the third signal from the third switch directly to the secondary input node of the first T-coil circuit.

16. The system of claim 13, the switch circuit further comprising:
a third input to receive a third signal;
a third switch coupled between the third input and the secondary input node of the first T-coil circuit, the third switch to switchedly configure a third signal path for the third signal; and
a fourth switch to switchedly configure a fourth signal path between the second switch and the secondary input node of the first T-coil circuit, wherein the fourth signal path is also between the third switch and the secondary input node of the first T-coil circuit.

17. The system of claim 13, the one or more T-coil circuits further comprising a second T-coil circuit, wherein the second switch is coupled between the second input and the primary input node of the second T-coil circuit, and wherein the output node of the second T-coil circuit is coupled to the secondary input node of the first T-coil circuit, the switch circuit further comprising:
a third input to receive a third signal; and
a third switch coupled between the third input and the second T-coil circuit, the third switch to switchedly configure a third signal path for the third signal.

18. The system of claim 13, the one or more T-coil circuits further comprising:
a second T-coil circuit, wherein the second switch is coupled between the second input and the primary input node of the second T-coil circuit, and wherein the output node of the second T-coil circuit is coupled to the secondary input node of the first T-coil circuit; and
a third T-coil circuit, wherein the output node of the third T-coil circuit is coupled to the secondary input node of the second T-coil circuit;
the switch circuit further comprising:
a third input to receive a third signal; and a third switch coupled between the third input and the primary input node of the third T-coil circuit, the third switch to switchedly configure a third signal path for the third signal.

19. The system of claim 13, the source device further comprising a plurality of transmit circuits each coupled to a respective input of the switch circuit, the plurality of transmit circuits including a first transmit circuit to provide the first signal to the first input and a second transmit circuit to provide the second signal to the second input.

20. The system of claim 13, the source device further comprising control logic coupled to the switch circuit, the control logic to transition the switch circuit between a first configuration and a second configuration, including the control logic to change a switch state of one of the first switch and the second switch.

* * * * *